United States Patent [19]

Mangelsdorf et al.

[11] Patent Number: 5,418,408

[45] Date of Patent: May 23, 1995

[54] CURRENT MODE SAMPLE-AND-HOLD AMPLIFIER

[75] Inventors: Christopher W. Mangelsdorf, Reading; David H. Robertson, Somerville; Douglas A. Mercer, Bradford; Peter Real, Groveland, all of Mass.

[73] Assignee: Analog Devices, Inc., Norwood, Mass.

[21] Appl. No.: 183,635

[22] Filed: Jan. 7, 1994

Related U.S. Application Data

[63] Continuation of Ser. No. 65,527, May 20, 1993, abandoned, which is a continuation of Ser. No. 762,942, Sep. 19, 1991, abandoned, which is a continuation of Ser. No. 412,412, Sep. 26, 1989, abandoned.

[51] Int. Cl.⁶ ............................................. G11C 27/02
[52] U.S. Cl. ................................................. 327/95; 327/94
[58] Field of Search ............... 307/353, 490, 491, 494, 307/542, 352; 328/151, 128

[56] References Cited

U.S. PATENT DOCUMENTS

| | | | |
|---|---|---|---|
| 3,671,782 | 6/1972 | Wittlinger et al. | 307/238 |
| 4,142,117 | 2/1979 | Chang | 307/353 |
| 4,302,689 | 11/1981 | Brodie | 307/352 |
| 4,370,572 | 1/1983 | Cosand et al. | 307/353 |
| 4,672,239 | 6/1987 | Thommen | 307/353 |
| 4,691,125 | 8/1987 | Rybicki | 307/353 |
| 4,700,143 | 10/1987 | Anthony et al. | 328/151 |
| 4,701,715 | 10/1987 | Amazawa et al. | 328/165 |
| 4,785,250 | 11/1988 | Lawton | 328/127 |
| 4,833,345 | 5/1989 | Miller | 307/353 |
| 4,893,088 | 1/1990 | Myers et al. | 328/127 |
| 4,959,649 | 9/1990 | Akano | 340/870 |

FOREIGN PATENT DOCUMENTS 0037258 10/1981 European Pat. Off. ...... G11C 27/02

OTHER PUBLICATIONS

Franco, "Use transductance amplifiers to make . . . relationships," Electronic Design 19, Sep. 13, 1976 pp. 98-101.
"Fast-Settling and Hold Circuit", IBM Technical Disclosure Bulletin, vol. 23, No. 12, May '81.
IEEE Journal of Solid-State Circuits, vol. 24, No. 6, Dec. 1989, Mehrdan Nayebi and Bruce A. Wooley: "A 10-bit Video BiCMOS Track-and-hold Amplifier", see p. 1508, col. 1-col. 2; FIGS. 1c, 2.
Electronic Design, vol. 36, No. 21, Sep. 1988, Frank-goodenough: "Sampling Amplifiers: The Choice Grows", see p. 65, col. 3-p. 70, col. 3; FIG. 2c.
Electronic Design, vol. 38, No. 2, Jan. 1990, John Sylvan: "Build Precise S/H Amps for Fast 12-Bit ADCS", see p. 58, col. 1; p. 59, col. 3, column 2; FIGS. 1,2.
IEEE Journal of Solid-State Circuits, vol. 24, No. 6, Dec. 1989, Masayuki Ishikawa and Tsuneo Tsukahara: "An 8-bit 50-MHz CMOS Subranging A/D Converter with Pipelined Wide-Band S/H", see p. 1487, col. 2-p. 1488, col. 2; FIG. 6.
IEEE Journal of Solid-State Circuits, vol. 24, No. 5, Oct. 1989, Germano Nicollini: "A Fully Differential Sample-and-Hold Circuit for High-Speed Applications":, see p. 1461-p. 1464.

*Primary Examiner*—Timothy P. Callahan
*Assistant Examiner*—Toan Tran
*Attorney, Agent, or Firm*—Wolf, Greenfield & Sacks

[57] ABSTRACT

A sample-and-hold amplifier in which the held signal is represented as a voltage across a capacitor, but all other signals are represented as currents. At a summing node, the input current and a feedback current are summed to produce a difference current. In the tracking mode, this difference current flows through a closed hold switch onto the input of an integrator. The integrator accumulates the difference current onto the hold capacitor, where it becomes the hold voltage. This hold voltage is converted into a feedback current by a first transconductance amplifier, to provide the negative feedback to the summing node. The hold voltage, which need not equal the input signal, is also applied to the input of a second transconductance amplifier, which provides an output current. The ratio of the two transconductance gains determines the gain accuracy and linearity of the current output. When the hold switch is opened, there is no longer a current path into the hold capacitor, and the output current remains where it was at the moment the switch was opened.

15 Claims, 4 Drawing Sheets

CURRENT MODE SAMPLE-AND-HOLD AMPLIFIER

This application is a continuation of application Ser. No. 08/065,527, filed May 20, 1993 which in turn is a continuation of application Ser. No. 07/762,942, filed on Sep. 19, 1991 which in turn is a continuation of Ser. No. 07/412,412, filed on Sep. 26, 1989, all are now abandoned.

FIELD OF THE INVENTION

This invention relates to a high-speed sample-and-hold (or track-and-hold) amplifier which allows current or voltage input and provides both a current and voltage representation at the output.

BACKGROUND

Sample-and-hold amplifiers, and their close cousins, track-and-hold amplifiers, are widely used electronic building blocks. They are employed, for example, to obtain instantaneous samples of time-varying signals, for signal conversion and discrete signal processing systems.

The sample-and-hold amplifier field is well-developed, with a great variety of architectural variations and specific designs being available, implemented both monolithically and in discrete systems. In general, SHA's may be classified into two categories: (1) closed loop SHA architectures, tending to provide greater accuracies at lower speeds and (2) open loop schemes, which offer the greatest bandwidths but seldom provide accuracy beyond the eight-bit level.

Although SHA's are typically configured to handle signals in the voltage mode, the advantages afforded by current-mode analog systems become more pronounced when seeking greater and greater system bandwidths and clocking frequencies. Conventional voltage-mode SHA's are extremely cumbersome to adapt into current-mode systems, however. They require current-to-voltage and voltage-to-current conversions. In a system where both high accuracy and high speed are important, these conversions can be very difficult to implement, and they add significant circuit complexity and power dissipation.

An additional feature required by many analog systems is gain in the SHA. This is realizable in the closed loop schemes by putting attenuation in a feedback network, as would be done with any operational amplifier. Just as in conventional operational amplifier theory, however, this runs into some rather severe limitations at high frequencies, where the gain-bandwidth product of the amplifier imposes the trade-off that the greater the gain used, the lower the bandwidth of the SHA will be. This can have serious ramifications, not only on the bandwidth of the SHA, but also on the acquisition time and the sample-and-hold settling time.

Additional general principles and background on SHA circuits may be obtained from extensive published texts and articles on the subject.

Accordingly, it is an object of the present invention to provide an improved sample-and-hold amplifier which implements a closed-loop architecture, but: which still provides excellent bandwidth and sampling frequency.

Another object of the invention is to provide a sample-and-hold amplifier which generates a current output.

A further object of the invention is to provide a sample-and-hold amplifier which generates both a current output and a voltage output.

Yet another object of the invention is to provide a sample-and-hold amplifier which will accept a current or voltage input and provide both a current and voltage representation at the output.

SUMMARY OF THE INVENTION

The foregoing and other advantages of the present invention are achieved in a sample-and-hold amplifier in which the :held signal is still represented as a voltage across a capacitor, but all other signals are represented as currents. Voltage inputs are accommodated through an optional input transconductance stage, while current inputs are wired directly into the loop. The input current, whether directly or through a transconductance stage, is supplied to a summing node at which the input current and a feedback current are summed to produce a difference current. In the tracking mode, this difference current flows through a closed hold switch onto the input of an integrator. The integrator accumulates the difference current onto the hold capacitor, where it becomes the hold voltage. This hold, voltage is converted into a feedback current by a first transconductance amplifier to provide negative feedback to the summing node. The hold voltage is also applied to the input of a second transconductance amplifier, which provides an output current. The ratio of the two transconductance gains determines the gain accuracy and linearity of the current output. When the hold switch is opened, there is no longer a current path into the hold capacitor, and the output current remains where it was at the moment the switch was opened.

The invention will be more fully understood from the detailed description presented below, which should be read in conjunction with the accompanying drawing.

DETAILED DESCRIPTION

Figure 1:
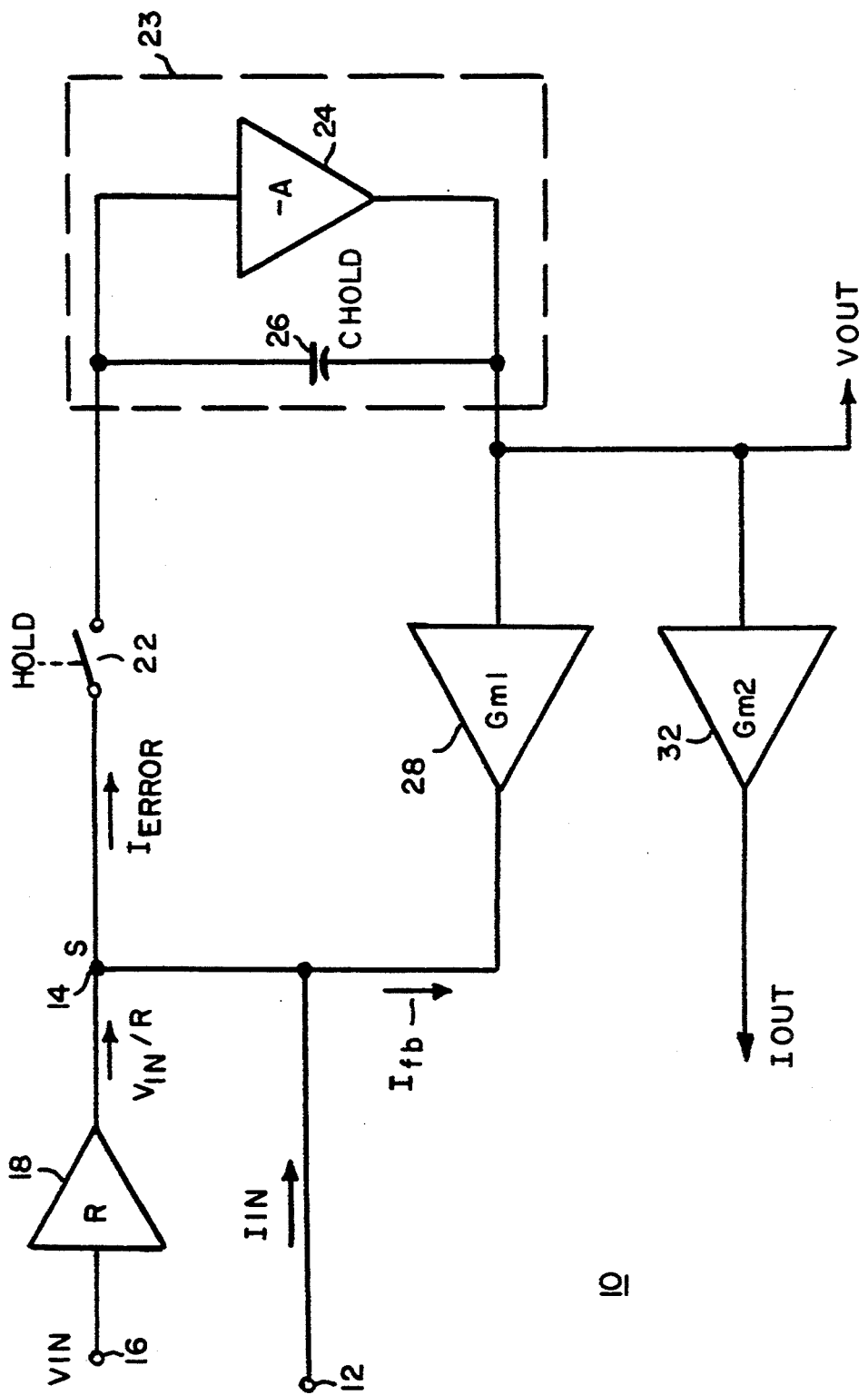
FIG. 1 is a block diagram of a current-mode sample-and-hold amplifier according to the present invention.

Referring now to FIG. 1, a sample-and-hold amplifier 10 according to the present invention is shown. An input current $I_{in}$ may be applied at current input terminal 12, from which it is supplied to a summing node 14. Alternatively, an input voltage $V_{in}$ may be applied to terminal 16 to an input transconductance 18 of transconductance value R; this establishes an input current $V_{in}/R$ to summing node 14. Only one of the inputs (voltage or current) is used at a time, although they may both be implemented in the same embodiment. A feedback current $I_{fb}$ is also supplied to node 14. The difference between the input current node 14 and the feedback current forms an error which is provided to a first terminal 22-1 of a hold switch 22 current $I_{error}$. In the sampling or tracking mode, hold switch 22 is in the closed position (the open, or sampling, position being illustrated in FIG. 1) and the difference current $I_{error}$ is applied from the second terminal thereof, 22-2, to the input of an integrator 23. The integrator 23 comprises an amplifier 24 with a capacitor 26 providing feedback from its output to its input. The output from integrator 23 is the "hold" voltage which is supplied to a first transconductance amplifier 28 and a second transconductance amplifier 32. Amplifier 28 provides a feedback transconductance $G_{m1}$, which generates feedback current $I_{fb}$ into node 14. Second transconductance amplifier 32 presents a transconductance $G_{m2}$, which generates the output current $I_{out}$. When the switch 22 is in the closed position, the hold capacitor 26 accumulates the charge of the error current, where it becomes the hold voltage. When the hold switch 22 is opened, there is no path for charge leakage from the hold capacitor 26, the hold voltage remains fixed and output transconductance amplifier 32 remains driving by the same holding voltage present immediately before the switch was opened, so the output current does not change. In a simple, idealized case, the output transconductance $G_{m2}$ is an identical copy of the feedback transconductance $G_{m1}$, and produces an identical copy of the feedback current. In practice, the ratio of the transconductances $G_{m1}$ to $G_{m2}$ determines the current gain of the circuit. Feedback has forced the feedback current to be the same as the input current, so the output current is now the same as the input current.

If amplifier 24 is implemented properly, the bandwidth of the loop will be determined by the feedback transconductance and the value of the hold capacitance 26. The scaling and linearity of the current input to voltage output transfer function depends primarily on the value and linearity of $G_{m1}$.

Figure 2:
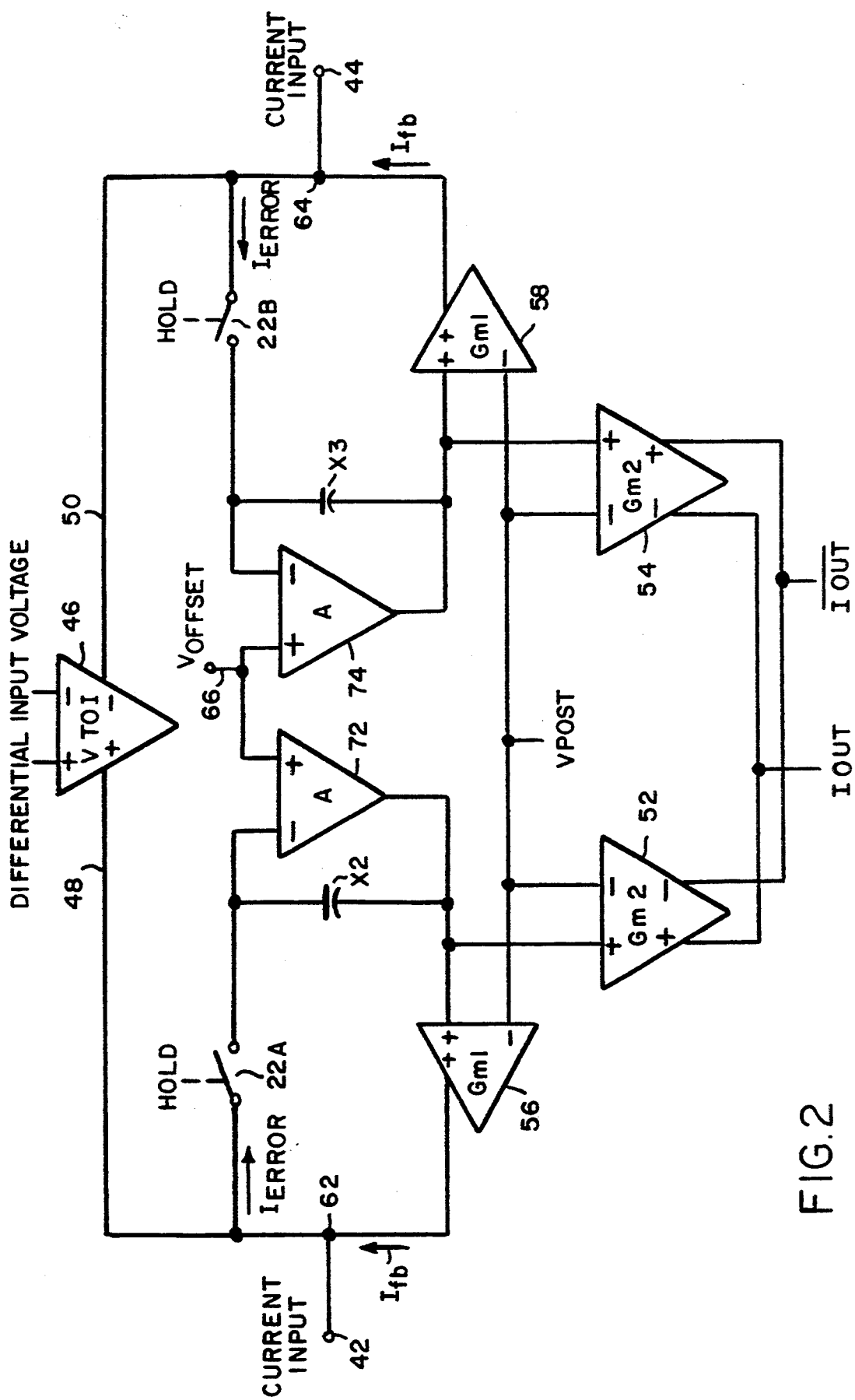
FIG. 2 is a block diagram of a first differential implementation of a sample-and-hold amplifier in accordance with the principles of FIG. 1.

FIG. 2 illustrates a differential implementation of the sample-and-hold amplifier according to FIG. 1. In this case, differential input currents $I_{in1}$ and $I_{in2}$ may be applied directly to the first and second current inputs 42 and 44, or differential input voltage may be applied to a differential transconductance amplifier 46, which provides differential output current on lines 48 and 50 (or a single-ended output of the currents on line 48, 50 is used). The remainder of the interior loops are symmetrical. The common mode gain from input currents to feedback currents is the same as the differential gain, so there is no common mode rejection from the input currents to the hold voltages. The connection of the differential output transconductances 52 and 54 provides common mode rejection at the output currents. This configuration eliminates the need for a separate common mode feedback loop, and still provides excellent common mode rejection between the input and output signals. The hold voltages will be centered on the bias voltage Vpos, and the current summing nodes will be centered on the bias voltage Voffset.

Figure 3:
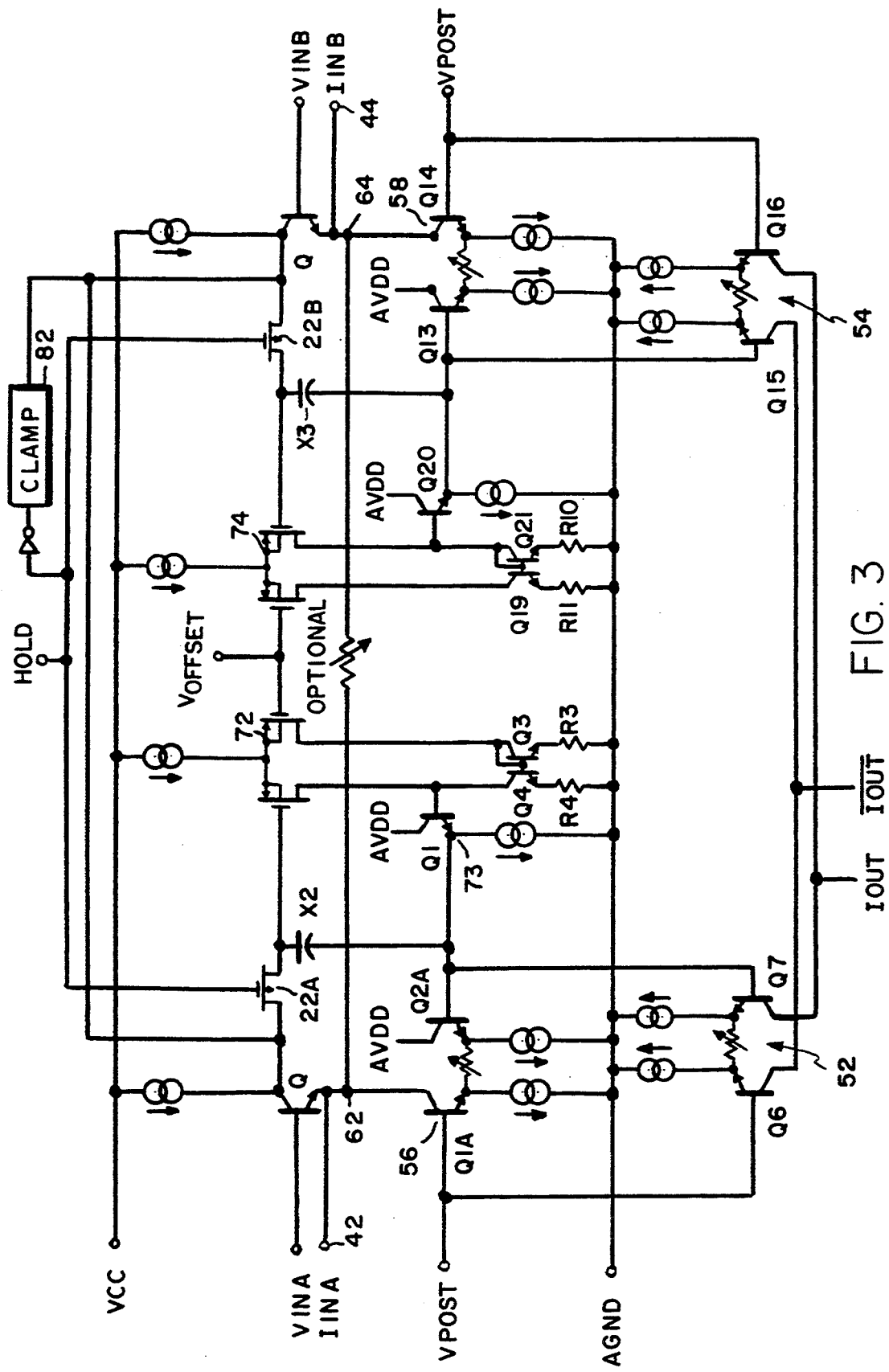
FIG. 3 is a simplified schematic circuit diagram of a monolithic BiMOS implemenation of circuitry for the sample-and-hold amplifier of FIG. 2.

A simplified schematic circuit diagram of a monolithic BiCMOS implementation of circuitry for the sample-and-hold amplifier of FIG. 2 is shown in FIG. 3. Like elements have been given like reference numerals, so a detailed discussion of the circuitry should not be necessary. Focussing on just one "side" (the two sides being mirror images), the integrator 72 is a MOS input op amp (M10, M11) with a single stage of gain and an emitter follower output buffer 73. The transconductance amplifiers 52, 54, 56, and 58 are implemented with thin-film resistor degenerated NPN bipolar transistor differential pairs. The hold switches 22A and 22B are simple NMOS devices. Low impedance current summing junctions 62 and 64 are provided at the emitters of transistors Q6 and Q16. The resistor $R_{GM}$ is optional. For the voltage input configuration, that resistor is connected between the two current summing nodes and nodes Vina and Vinb become high-impedance differential voltage inputs. For current inputs, nodes Vina and Vinb are connected to a bias voltage; and input currents are fed to the current summing nodes.

In the voltage-input mode, the circuit provides a very high-speed buffered voltage-to-current conversion. The circuit can be configured to allow various values of resistance for $R_{GM}$, thereby providing a programmable gain amplifier effect for voltage inputs.

The clamp circuit 82, shown in block form, is added to stabilize the collectors of transistors Q6 and Q16 when the hold switch is opened.

Both voltage and current outputs are available, since the hold voltage may be used as an output. In the case of the hold voltage, the scaling and linearity is determined by the feedback transconductance amplifier. For the output currents, the scaling and linearity are determined by the ratio and matching of the output transconductance to the feedback transconductance. Furthermore, additional current gain is provided by adjusting the, output transconductance, and therefore does not impact on the dynamics of the feedback loop.

Figure 4:
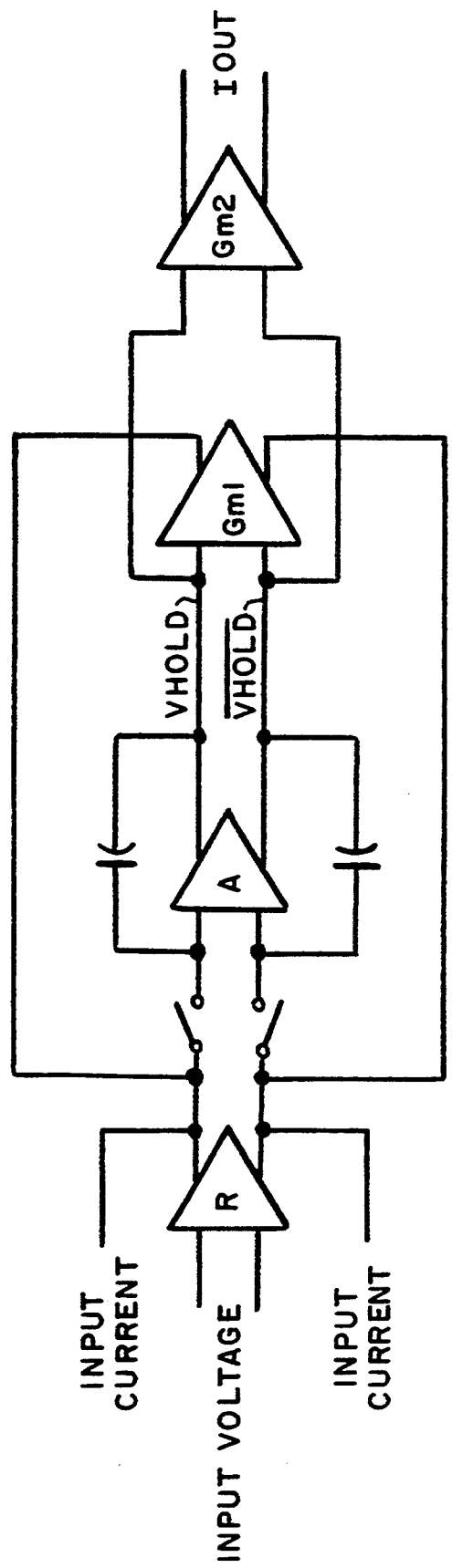
FIG. 4 is a block diagram of a second, fully differential implementation for an SHA according to the invention.

As FIG. 2 illustrates, the invention provides excellent common mode rejection for the current output without introducing the static and dynamic complexities of a separate common mode feedback, loop. One limitation of this implementation. however, is that the common mode rejection is not realized until the output stage. Therefore, the internal nodes in the SHA feedback loop, including the hold voltage, must have sufficient compliance to absorb common. mode signals. A variation is therefore shown in FIG. 4, which illustrates a fully differential implementation.

In the foregoing exemplifications, an active integrator has been shown. A passive integrator can also be employed—i.e., a capacitor in a loop with a transconductance stage, without an associated op amp. This will still allow the accumulation of change from the "error" signal.

As will now be seen, the present invention differs from all or most prior SHA's in a fundamental respect: the present SHA holds neither the input nor the output quantity. Generally, SHA designers try to replicate the input signal on the hold capacitors. Here, the input signal is converted to an intermediate quantity which is held, instead. The intermediate quantity does not have to bear any special relation to the input signal except that it carries enough information to re-create the signal. The voltage which "stores" the current mode signal need not even be linear with the input.

Having thus described the basic concept of the invention, a basic block diagram implementation and multiple embodiments, it will be readily apparent to those skilled in the art that the foregoing detailed disclosure is intended to be presented by way of example only, and is not limiting. Various alterations, improvements, and modifications will occur and are intended to those skilled in the art, though not expressly stated herein. These modifications, alterations, and improvements are intended to be suggested to be suggested hereby, and are within the spirit and scope of the invention. Accordingly, the invention is limited only by the following claims and equivalents thereto:

What is claimed is:

1. A sample-and-hold amplifier for sampling an input current signal and providing an output signal, comprising:
   a. a hold switch responsive to a sampling signal and having first and second switchable terminals;
   b. a current summing junction for receiving the input current and a feedback current and for providing directly to the first terminal of the hold switch an error current which is equal in amplitude to the difference between the input current and said feedback current;
   c. an integrator having an input connected to said second terminal of the hold switch and a voltage output;
   d. a feedback transconductance element having an input terminal connected to receive the output voltage of the integrator and to supply at a second terminal thereof the feedback current responsive to the voltage output of the integrator;
   e. the integrator including an amplifier and a holding capacitor, the holding capacitor being coupled between an input and an output of the amplifier and receiving the error current when the hold switch is closed; and
   f. an output terminal coupled to the output of said integrator through one of (i) a direct connection which supplies a voltage to said output terminal and (ii) an output transconductance element which receives a voltage from said integrator and supplies a current to said output terminal.

2. A sample-and-hold amplifier for sampling an input signal and providing an output signal, comprising:
   a. a hold switch responsive to a sampling signal and having first and second switchable terminals;
   b. a current input terminal;
   c. a transistor having an input terminal coupled to the current input terminal in order to receive an input current and further coupled to receive a feedback current, said transistor further having an output terminal coupled to the first terminal of the hold switch;
   d. a current summing junction coupled to said input terminal for providing to the first terminal of the hold switch an error current which is proportional in amplitude to the difference between the input current and the feedback current;
   e. an integrator having an input connected to said second terminal of the hold switch and an output;
   f. a feedback transconductance element having an input terminal connected to receive the output voltage of the integrator and supply at an output terminal thereof the feedback current responsive to the voltage output of the integrator;
   g. the integrator including a holding capacitor for storing a charge provided by the error current when the hold switch is closed; and
   h. an output terminal coupled to the output of said integrator through one of (i) a direct connection which supplies a voltage to said output terminal and (ii) an output transconductance element which receives a voltage from said integrator and supplies a current to said output terminal.

3. A sample-and-hold amplifier for sampling an input signal and providing an output signal, comprising:
   a. a hold switch responsive to a sampling signal and having first and second switchable terminals;
   b. a voltage input terminal;
   c. a current input terminal;
   d. a transistor having an input terminal coupled to the current input terminal, a control terminal coupled to the voltage input terminal and an output terminal coupled to the first terminal of the hold switch so that an input current is provided at said input terminal of said transistor;
   e. a current summing junction coupled to said input terminal and to receive a feedback current and for providing to the first terminal of the hold switch an error current which is proportional in amplitude to the difference between the input current and the feedback current;
   f. an integrator having an input connected to said second terminal of the hold switch and an output;
   g. a feedback transconductance element having an input terminal connected to receive the output voltage of the integrator and supply at an output terminal thereof the feedback current responsive to the voltage output of the integrator;
   h. the integrator including a holding capacitor for storing a charge provided by the error current when the hold switch is closed; and
   i. an output terminal coupled to the output of said integrator through one of (i) a direct connection which supplies a voltage to said output terminal and (ii) an output transconductance element which receives a voltage from said integrator and supplies a current to said output terminal.

4. A sample-and-hold amplifier as set forth in any of claims 2 and 3 wherein the feedback transconductance is a resistor.

5. A sample-and-hold amplifier for sampling an input current signal and providing an output signal, comprising:
   a. a hold switch responsive to a sampling signal and having first and second switchable terminals;
   b. a current summing junction for receiving the input current and a feedback current and for providing to the first terminal of the hold switch an error current which is equal in amplitude to the difference between the input current and said feedback current;
   c. an integrator having an input connected to said second terminal of the hold switch and providing an output voltage;
   d. a feedback transconductance element having an input terminal connected to receive the output voltage of the integrator, and supply at an output terminal the feedback current responsive to the voltage output of the integrator and wherein said feedback transconductance element comprises a differential pair of transistors;
   e. the integrator including an amplifier and a holding capacitor, the holding capacitor being coupled between an input and an output of the amplifier and receiving the error current when the hold switch is closed; and
   f. an output terminal coupled to the output of said integrator through one of (i) a direct connection which supplies a voltage to said output terminal and (ii) an output transconductance element which receives a voltage from said integrator and supplies a current to said output terminal.

6. The sample-and-hold amplifier of any one of claims 1, 2, 3 and 5 wherein the output terminal comprises both a first output terminal coupled directly to the output of said integrator and a second output terminal coupled to the output of the integrator through an output transconductance element.

7. The sample-and-hold amplifier of claim 1 further including an input transconductance element, having an output connected to supply to the summing junction means said input signal and having an input connected to receive an input voltage to be sampled.

8. A sample-and-hold amplifier for sampling a pair of currents comprising first and second differential input currents and providing at least one corresponding output current, comprising;
 a. a first hold switch responsive to a sampling signal and having first and second switchable terminals;
 b. means for providing to one terminal of the first hold switch a first error current which is the difference between the first differential input current and a first feedback current;
 c. a first integrator formed of a first differential amplifier and a first capacitor, the differential amplifier having first and second inputs, with the first input of said amplifier being connected to a second terminal of the first hold switch;
 d. a first feedback differential transconductance amplifier for receiving first and second differential input voltages and supplying a corresponding output current, said output current being the first feedback current;
 e. the output of the first integrator being connected to supply the first differential input voltage to the first feedback differential transconductance amplifier;
 f. a second hold switch. responsive to a sampling signal and having first and second switchable terminals;
 g. means for providing to one terminal of the second hold switch a second error current which is the difference between the second differential input current and a second feedback current;
 h. a second integrator formed of a second differential amplifier and a second capacitor, the differential amplifier having first and second inputs, with the first input of said amplifier being connected to a second terminal of the second hold switch;
 i. a second feedback differential transconductance amplifier for receiving second and third differential input voltages and supplying a corresponding output current, said output current being the second feedback current;
 j. the output of the second integrator being connected to supply the third differential input voltage to the second feedback differential transconductance amplifier;
 k. the second differential input voltage supplied to the first and second feedback differential transconductance amplifiers being a bias voltage;
 l. the first and second differential amplifiers receiving an offset voltage; and
 m. transconductance means responsive to the second differential input voltage and at least one of the first and third differential input voltages, for supplying at least one output current corresponding to the values of said voltages.

9. A sample-and-hold amplifier for sampling a pair of currents comprising first and second differential input currents and providing at least one corresponding output currrent, comprising:
 a. first and second hold switches, each responsive to a sampling signal and having first and second switchable terminals;
 b. the first terminal of the first hold switch being connected to receive a first error current which is the difference between the first differential input current and a first feedback current;
 c. the first terminal of the second hold switch being connected to receive a second error current which is the difference between the second differential input current and a second feedback current;
 d. an integrator formed of a first differential amplifier and first and second capacitors, the differential amplifier having first and second inputs and first and second outputs of equal amplitudes but opposite polarities,
  1. the first input of said amplifier being connected to the second terminal of the first hold switch and to a first terminal of the first capacitor,
  2. the second input of said amplifier being connected to the second terminal of the second hold switch and to a first terminal of the second capacitor,
  3. the first output of the amplifier being connected to the second terminal of the first capacitor, and
  4. the second output of the amplifier being connected to the second terminal. of the second capacitor; and
 e. a first differential transconductance amplifier having first and second differential inputs for receiving first and second differential input voltages and first and second outputs for supplying first and second differential output currents, the first differential input being connected to the first output of the amplifier and the second differential input being connected to the second output of the amplifier, the first differential output of the transconductance amplifier being connected to supply the first feedback current and the second output thereat being connected to supply the second feedback current.

10. The sample-and-hold amplifier of claim 9 further including:
 f. a second differential transconductance amplifier having first and second differential inputs for receiving first and second differential input voltages and first and second outputs for supplying first and second differential output currents, the first differential input thereof being connected to the first output of the amplifier and the second differential input thereof being connected to the second output of the amplifier.

11. The sample-and-hold amplifier of any one of claims 1, 2 and 3 wherein said current summing junction is coupled directly to one terminal of the hold switch without passage through an intervening amplifier.

12. The sample-and-hold amplifier of any one of claims 1, 2, 3 and 5 wherein said feedback transconductance element comprises a differential pair of transistors.

13. The sample-and-hold amplifier of claim 12 wherein the output terminal comprises both a first output terminal coupled directly to the output of the integrator and a second output terminal coupled to the output of the integrator through an output transconductance element.

14. The sample-and-hold amplifier of claim 13 wherein said output-transconductance element comprises first and second input terminals connected to receive the output voltage of the integrator and a reference voltage, respectively, and supply at a third terminal thereof an output current responsive to the output voltage of the integrator.

15. The sample-and-hold amplifier of claim 14 wherein said output transconductance element comprises a differential pair of transistors.

* * * * *